US012430720B2

United States Patent
Amthor et al.

(10) Patent No.: US 12,430,720 B2
(45) Date of Patent: Sep. 30, 2025

(54) METHOD FOR COMPRESSED SENSING AND PROCESSING OF IMAGE DATA

(71) Applicant: Carl Zeiss Microscopy GmbH, Jena (DE)

(72) Inventors: Manuel Amthor, Jena (DE); Daniel Haase, Jena (DE); Ralf Engelmann, Jena (DE)

(73) Assignee: Carl Zeiss Microscopy GmbH, Jena (DE)

( * ) Notice: Subject to any disclaimer, the term of this patent is extended or adjusted under 35 U.S.C. 154(b) by 283 days.

(21) Appl. No.: 18/155,289

(22) Filed: Jan. 17, 2023

(65) Prior Publication Data
US 2023/0230209 A1 Jul. 20, 2023

(30) Foreign Application Priority Data
Jan. 18, 2022 (DE) .................. 10 2022 200 557.0

(51) Int. Cl.
*G06T 5/00* (2024.01)
*G06T 5/70* (2024.01)
*H01J 37/22* (2006.01)
*H01J 37/28* (2006.01)

(52) U.S. Cl.
CPC .............. *G06T 5/70* (2024.01); *H01J 37/222* (2013.01); *H01J 37/28* (2013.01); *G06T 2207/10061* (2013.01); *H01J 2237/221* (2013.01)

(58) Field of Classification Search
CPC .............. G06T 5/70; G06T 2207/10061; H01J 37/222; H01J 37/28; H01J 2237/221
See application file for complete search history.

(56) References Cited

U.S. PATENT DOCUMENTS

| 2016/0300368 | A1* | 10/2016 | Flohr | G06T 11/005 |
| 2018/0158241 | A1* | 6/2018 | Lee | G06T 19/20 |
| 2021/0239952 | A1 | 8/2021 | Haase et al. | |

FOREIGN PATENT DOCUMENTS

| DE | 102019114459 | 12/2019 | |
| WO | WO-2011151821 A1 * | 12/2011 | G06T 7/0012 |

OTHER PUBLICATIONS

Ede et al., Partial Scanning Transmission Electron Microscopy with Deep Learning, Scientific Reports, vol. 10, 8332, 2020, 10 pages.
Photoshop Training Channel: "Add Noise To Make a More Cohesive Composition". web.archive.org, Sep. 1, 2016, 1 page.

* cited by examiner

*Primary Examiner* — Quang N Vo
(74) *Attorney, Agent, or Firm* — Grüneberg and Myers PLLC

(57) ABSTRACT

A method can be used for sensing and processing image data for an object to be imaged. The object is scanned incompletely by virtue of regions (eB) of the object being sensed, where the sensed image regions (eB) alternate with non-sensed image regions (neB) of the object. Image data (rBD) of the non-sensed image regions (neB) are reconstructed on the basis of the sensed image data (eBD) of the sensed image regions (eB). A noise signal (N) of the sensed image data (eBD) of the sensed regions (eB) is ascertained and transferred to the reconstructed image data (rBD) of the non-sensed regions (neB), so that a user obtains a homogeneous visual impression in relation to the noise arising in the overall image data of the object visualized in a resultant overall image ($rGB_{Inv}$).

10 Claims, 5 Drawing Sheets

- Prior Art -

Fig. 2 - Prior Art -

METHOD FOR COMPRESSED SENSING AND PROCESSING OF IMAGE DATA

CROSS-REFERENCE TO RELATED APPLICATIONS

This application claims priority to Germany Application No. 10 2022 200 557.0, filed on Jan. 18, 2022, the content of which is hereby incorporated by reference in its entirety,

BACKGROUND OF THE INVENTION

Field of the Invention

The invention relates to a method for the compressed sensing of image data and the processing thereof.

Description of Related Art

The compressed sensing of image data is understood to mean methods in which image data are sensed with a lower data density than would in fact be possible from a technical point of view (so-called "undersampling"; incomplete scanning), For example, should a high-resolution camera or detector be used, it may be possible to sense only a subset of the image data from all pixels if the subsequent use of the image data is intended to be implemented at a lower resolution. In this case, the set of sensed image data is smaller than what could in fact be made available by the respective camera or by the respective detector.

The advantage of such compressed sensing lies in reduced storage requirements and a possible dispensation of computational-technical steps for subsequent reduction of the already sensed image data.

In the field of sensing images of specimens, in particular in microscopy, one option for such undersampling lies in the incomplete scanning of an object to be imaged. In the process, sensed image regions usually alternate with non-sensed image regions in a fixed relationship. The image data of the non-sensed image regions are reconstructed using known methods (see DE 10 2018 113 014 A1; for example).

The reconstruction methods known from the prior art are directed to predicting the reconstructed image data of the non-sensed image regions with the highest possible quality and without noise. However, this leads to an inhomogeneous impression of a resultant overall image generated from the image data of the sensed image regions and the reconstructed image data from the non-sensed image regions. In the process, the actually sensed image data with an inherent noise signal differ from the image data reconstructed without a noise signal, with the result that there may be a clear formation of stripes, for example, in the resultant overall image.

By contrast, if use is made of reconstruction methods which reduce or remove a noise signal inherent to the image data of the sensed image regions ("denoising"), a homogeneous image impression arises but the actually sensed image data are modified at the same time, and these are no longer available as unfalsified data.

Although it is possible to sense image data with a very low to negligible noise signal, such methods require great expenditure of time and a high exposure of the object. The exposure by the illumination is disadvantageous, in particular, if the object is a biological specimen and/or a light-sensitive material.

SUMMARY OF THE INVENTION

The invention is based on the object of proposing an option for obtaining a uniform image impression, in which actually sensed image data remain unchanged at the same time.

The object is achieved by the subject matter as described below. Additional embodiments described also specify advantageous developments and uses of the invention.

The invention also includes the following embodiments:
1. Method for sensing and processing image data, wherein an object to be imaged is scanned incompletely by virtue of regions (eB) of the object being sensed and the sensed image regions (eB) alternating with non-sensed image regions (neB) of the object;
    image data (rBD) of the non-sensed image regions (neB) are reconstructed on the basis of the sensed image data (eBD) of the sensed image regions (eB);
    characterized in that
    a noise signal (N) of the sensed image data (eBD) of the sensed regions (eB) is ascertained and transferred to the reconstructed image data (rBD) of the non-sensed regions (neB) so that a user obtains a homogeneous visual impression in relation to the noise arising in the overall image data of the object visualized in a resultant overall image ($rGB_{Inv}$).
2. Method according to embodiment 1, characterized in that
    a selected noise signal (N) is applied to the reconstructed image data (rBD) of the non-sensed regions (neB),
    the effect of the selected noise signal (N) on the reconstructed image data (rBD) of the non-sensed regions (neB) is compared to the sensed image data (eB) of the sensed image regions (eB) and an observance of specified similarity criteria is verified, and
    a decision regarding the application of a modified noise signal (N) to the reconstructed image data (rBD) of the non-sensed regions (neB) should specified similarity criteria not be satisfied is made on the basis of a result of the comparison.
3. Method according to embodiment 1, characterized in that
    the reconstructed image data (rBD) of the non-sensed image regions (neB) are generated by means of simulation models, the respectively used simulation model impressing a noise signal (N) on the reconstructed image data (rBD).
4. Method according to embodiment 1, characterized in that
    a resultant overall image (rGB) is predicted by means of a simulation model proceeding from the reconstructed image data (rBD) of the non-sensed image regions (neB), with parameters of a microscope (M) used for sensing that were used during the sensing of the sensed image data (eBD) of the sensed image regions (eB) being taken into account within the scope of the prediction.
5. Method according to embodiment 1, characterized in that
    an expected noise signal (N) of the sensed image data (eBD) of the sensed image regions (eB) is estimated before the object to be imaged is scanned and said expected noise signal is impressed following the scanning of the image data (rBD) of the non-sensed image regions (neB).

6. Method according to any one of the preceding embodiments, wherein the incomplete scanning is implemented by an electron microscope.
7. Method according to any one of embodiments 1 to 5, characterized in that the object is incompletely scanned with at least one first and one second spectral region and image data of non-sensed image regions (neB) of at least one spectral region not used for incomplete scanning are reconstructed in the form of reconstructed image data (rBD).
8. Method according to embodiment 7, characterized in that the wavelength ranges of at least two spectral regions do not overlap one another.
9. Method according to any one of the preceding embodiments, characterized in that the incomplete scanning is implemented only at specific points in time of a time period and non-sensed image regions (neB) of non-sensed points in time are reconstructed in the form of reconstructed image data (rBD).
10. Method according to any one of the preceding embodiments, characterized in that the incomplete scanning is implemented in the form of a z-stack, along an optical axis of an objective lens (OB) used for sensing of image data (eBD).

DETAILED DESCRIPTION OF THE INVENTION

Figure 1:
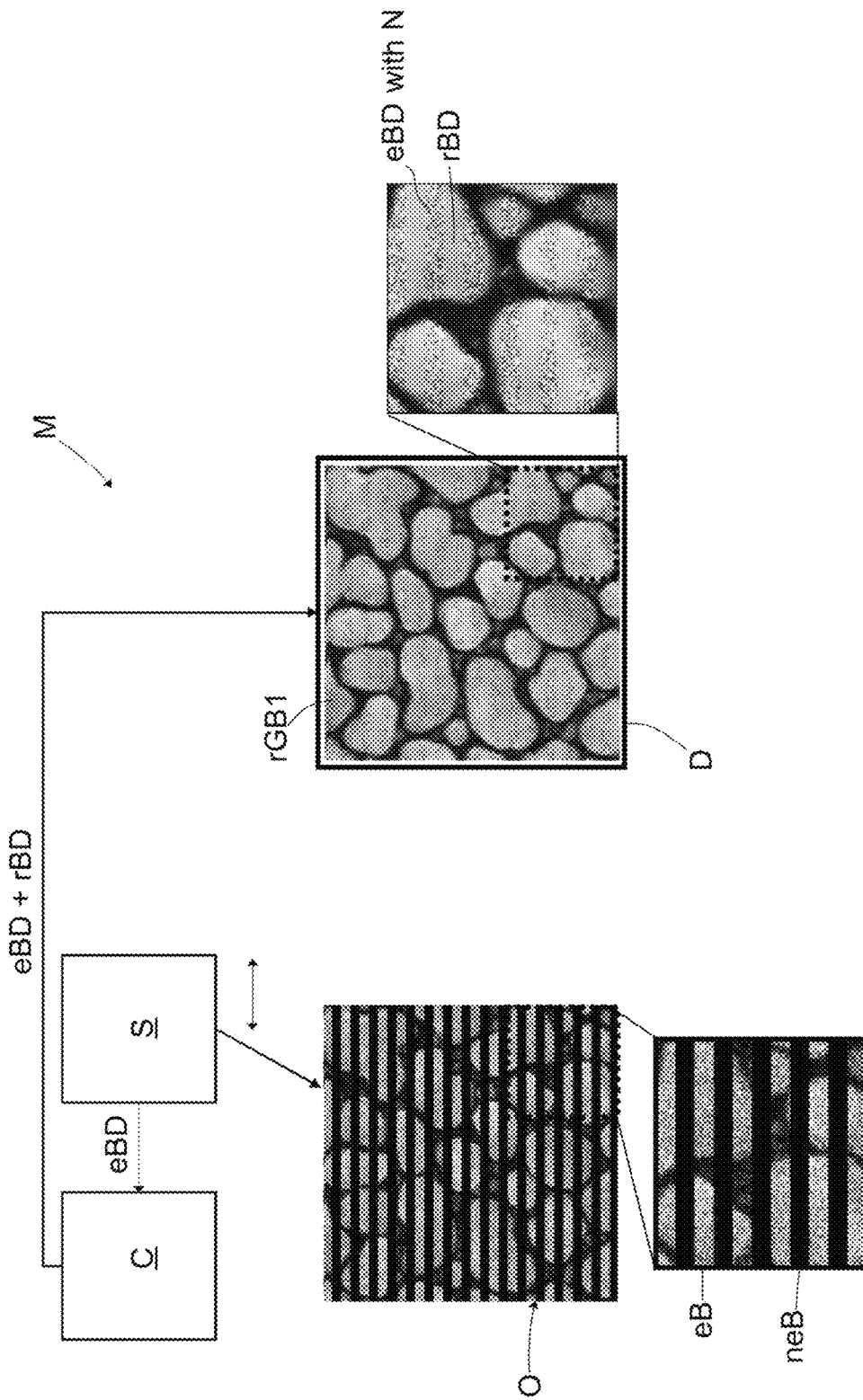
FIG. 1 shows a schematic representation of a first configuration of a method according to prior art, with an incompletely scanned object.

In a method for sensing and processing image data, especially in microscopy, an object to be imaged is scanned incompletely. To this end, regions of the object are sensed optically in particular, with these sensed image regions alternating with non-sensed image regions of the object in a fixed sequence or else in irregular fashion. By way of example, the object can be scanned in strips over its regions to be imaged, with one or more scanned strips being followed in each case by at least one strip which is not scanned and sensed. The image data of the non-sensed image regions are reconstructed with the sensed image data of the sensed image regions being taken into account. To this end, use is made, in particular, of reconstruction methods known from the prior art.

The method according to the invention is characterized in that a noise signal of the sensed image data of the sensed regions is ascertained and transferred to the reconstructed image data of the non-sensed regions. As a result, a user obtains a homogeneous visual impression in relation to the noise arising in the overall image data of the object visualized in a resultant overall image according to the invention.

At the same time, it is advantageous that the sensed image data of the sensed image regions are not modified.

For simplification, sensed image data of the sensed image regions are referred to as sensed image data below for short. The reconstructed image data of the non-sensed image regions are also referred to as reconstructed image data below for short.

The core of the invention lies in the concept of not providing the reconstructed image data without noise, as would be the case in methods from the prior art, but instead to impress a noise signal, which corresponds to the noise signal of the sensed image data, thereon. By way of example, noise signals can be based on photon noise, dark noise, and/or readout noise.

Incomplete scanning of the object to be imaged can be implemented in strips for example, more particularly line-by-line, by virtue of the object being scanned, for example by means of a point scanner or by means of a line scanner, along scan lines in particular. In the process, scanned and hence sensed image regions alternate with non-sensed image regions. In this case, the non-sensed image regions can be whole scan lines, sections of individual scan lines, and/or image regions selected in advance or random image regions. By way of example, the non-sensed image regions can be arranged in lines, in blocks or in sinusoidal fashion. Further possible variants of incomplete scanning may be implemented in spiral fashion, by following a line pattern or adaptively.

Different procedures are possible in adaptive incomplete scanning. In one configuration, currently sensed image data that were sensed on previously selected partial regions of the object to be imaged (in this regard, see DE 10 2019 114 459 A1, for example) may be used as the starting data of the reconstruction. The use of an overview image, on the basis of which a resultant overall image can be created, is likewise possible. Moreover, it is possible to refer to image data that were sensed at an earlier point in time. By way of example, it is also possible to sense image data with a first spectral region and to investigate them for the presence of predefined structures. By way of example, it is possible to identify a location and extent of cell nuclei with a first spectral region. This information may be used as the reference for approaching further positions or regions and for scanning (incompletely) image data with the first or with a different spectral region.

For appropriate scanning, use can he made of a scanning apparatus in the form of a controlled scanner that scans line by line, for example. To realize block scanning, for example, it is possible to use an appropriately driven point scanner. A point scanner guided line by line or a line scanner are able to be used for line-by-line scanning.

To reconstruct the image data of the non-sensed image regions, it is possible to use methods that are compatible with the respective way of recording the sensed image data, that is to say on the basis of which it is possible to generate a prediction (simulation). In addition to conventional methods from the prior art, such reconstruction methods may be machine learning methods (machine learning algorithm, deep learning algorithm) in particular. The method according to the invention can be implemented in various configurations, which are specified in exemplary fashion below.

The term noise signal is understood to mean not only a calculation rule for reproducing the noise but also a simulation model (noise model) which for example may be combined with or integrated in a simulation model for predicting the reconstructed image data and/or which is combinable with a simulation model for overlaying noise on already generated reconstructed image data.

In a first configuration of the method according to the invention, the noise of sensed image data is ascertained and transferred to the reconstructed image data by virtue of noise parameters of the noise signal of the sensed image data being estimated, for example. A noise signal containing the estimated noise parameters is applied to the reconstructed image data. By way of example, the noise parameters can be derived by virtue of the noise signal of the sensed image data being extracted, that is to say separated from the actual image data ("denoising"). By way of example, the ascertained noise signal can be evaluated by virtue of the denoised image data being compared, in particular visually compared, to the original image regions.

In a further configuration of the method according to the invention, a selected noise signal is applied to the reconstructed image data. Subsequently, the effect of the selected noise signal on the reconstructed image data is compared to the sensed image data. Should the comparison yield that the application of the selected noise signal to the reconstructed image data fulfils specified similarity criteria, this noise signal is maintained. By contrast, if the specified similarity criteria are not fulfilled, a different noise signal is applied to the sensed image data. This procedure can be implemented iteratively. By way of example, a targeted selection of a further noise signal may thus depend on the determined differences between the effect of the previously applied noise signal and the similarity criteria to be observed.

By way of example, an assessment of the effect of the applied noise signal can be implemented by means of a discriminator model which for example operates in a manner similar to a GAN (generative adversarial network).

Such models, referred to as GANs, may also be applied in a further possible configuration of the method according to the invention. In that case, the reconstructed image data are generated by means of simulation models. By way of example, these simulation models may be GANs which comprise a noise signal model. As a result of their effect, a noise signal is impressed on the reconstructed image data by the respectively used simulation model. To obtain the sensed image data in unmodified form, the application of the simulation models may be restricted to the non-sensed regions.

A further configuration of the method according to the invention contains a prediction or simulation of a resultant overall image proceeding from the reconstructed image data. In order to ascertain an adequate noise signal for the reconstructed image data, the parameters of an optical device, in particular a microscope, used for sensing that were used during the sensing of the image data of the sensed image regions can be taken into account within the scope of the prediction. Optionally, information relating to the observer, to the object to be imaged, and/or to an experiment to be carried out may additionally he made available and taken into account with due reference to the method according to the invention. Further information optionally to be taken into account may include, for example, sensor measured values such as the ambient temperatures of the microscope and/or of a utilized detector. A resultant overall image is put together from the sensed image data and from reconstructed image data that have been provided with a noise signal.

Furthermore, it is possible that an expected noise signal of the image data of the sensed image regions is estimated already before the incomplete scanning of the object to be imaged. Following the scanning, the expected noise signal is impressed on the reconstructed image data. By way of example, expected noise signals may be based on known parameters of an optical device, for example a microscope, used for sensing purposes. By way of example, the effects of the parameters of the optical device on the respective noise signals can be ascertained in advance and recallably stored in a database, for example in order to allow users to carry out the method according to the invention in comparable fashion at a later time.

The aforementioned additional information may also be taken into account in this configuration of the method.

It is also possible to ascertain the noise signal merely for selected types of noise, for example using the configuration of the method described above. Thus, the noise signal may be based substantially or entirely on, for example, an arising photon noise, dark noise, and/or readout noise.

The above-described configurations of the method according to the invention can be combined with one another. By way of example, the noise parameters can initially be estimated by virtue of sensed image data being compared to the image data reconstructed without noise. There can subsequently be an optimization, for example using a discriminator model.

To carry out the method according to the invention, a scanning microscope in particular, for example a laser scanning microscope, a scanning electron microscope, or the like, is advantageous. A suitable simulation environment in the form of a computer, a computer network or a virtual computing environment ("cloud") is also possible.

In special cases, the invention may also be applied within the scope of image sensing in the wide field. By way of example, such a case is given by incomplete scanning (undersampling) of the object in the z-direction (z-stack), that is to say in the direction of the optical axis of a detection objective lens. Such undersampling in z-direction may also be achieved by means of scanning microscopes (see above).

The listed possible configurations of the method according to the invention may also be applied to spectral region and time series in addition to the already mentioned z-stacking.

Thus incomplete scanning may he achieved in the form of a so-called lambda stack, wherein the object is respectively scanned with a beam in a narrow wavelength range. The width of the wavelength ranges used may be the same for all spectral regions used. In further configurations, one or more of the wavelength ranges may have different widths.

The spectral regions used for incomplete scanning may overlap one another. In other configurations, these may be separate from one another. it is possible to combine spectral regions that overlap one another and that do not overlap one another.

Incomplete scanning in the spectral region may be carried out advantageously with a restricted set of available filters. To achieve a reconstruction of the non-sensed regions subsequently, a corresponding simulation model, in which the wavelength ranges to be reconstructed are also included, is learned with a set of filters. Since only the actually available filters of the restricted set have to he kept accessible and applied in practical use, advantages result in terms of the complexity of the necessary technical equipment and of the time required to carry out image sensing or an experiment. The image data to be reconstructed for the non-sensed spectral regions correspond logically to the non-sensed image regions.

In addition, undersampling, especially of a z-stack, is possible over a specific time period. In some configurations of the invention, it is therefore not necessary to carry out image sensing for every technically possible point in time or time period. To the contrary, by using a simulation model learned from the reconstruction of a time series, it is possible to reconstruct image data that exist at points in time not actually sensed. The selection of those points in time at which image data are actually sensed and of those points in time at which reconstructed image data are generated may be implemented according to a fixed sequence, randomly or according to a dynamically adapted scheme, for example as a function of already existing or previously sensed image data. The points in time of non-sensed image data correspond logically to the above-described non-sensed image regions.

In further configurations of the method, it is also possible, at different points in time, to sense or reconstruct different positions in z-direction and/or different spectral regions, such as alternating spectral regions.

Advantages of the invention can be found in particular in the circumstances that the sensed image data are not modified and are available as measured values. The visual impression of the overall image is homogeneous to an observer to the extent that there is a uniform noise signal over the overall image. Transitions between image regions based on the sensed image data and image regions formed by reconstructed image data are reduced or visually imperceptible. As a consequence of overlaying the noise signal on the reconstructed image data as well, there is no suggestion to an observer of an incorrect accuracy or meaningfulness of the overall image, as would be the case, for example, in the case of compressed sensing with noise suppression (compressed sensing with denoising). Moreover, it is advantageous that no noise-free training data are required to train the simulation model (compressed sensing model).

Figure 2:
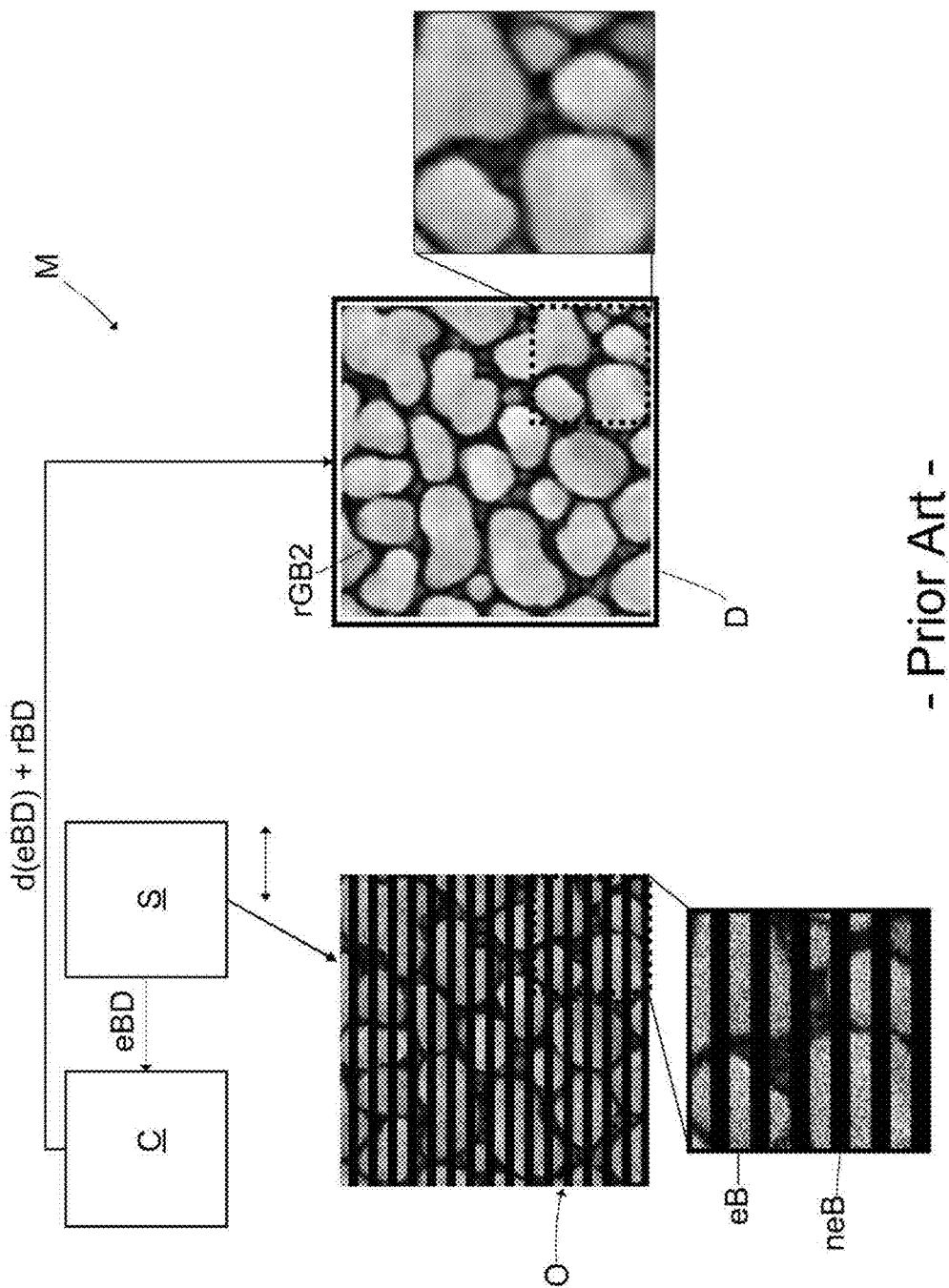
FIG. 2 shows a schematic representation of a second configuration of a method according to prior art, with an incompletely scanned object.
Figure 3:
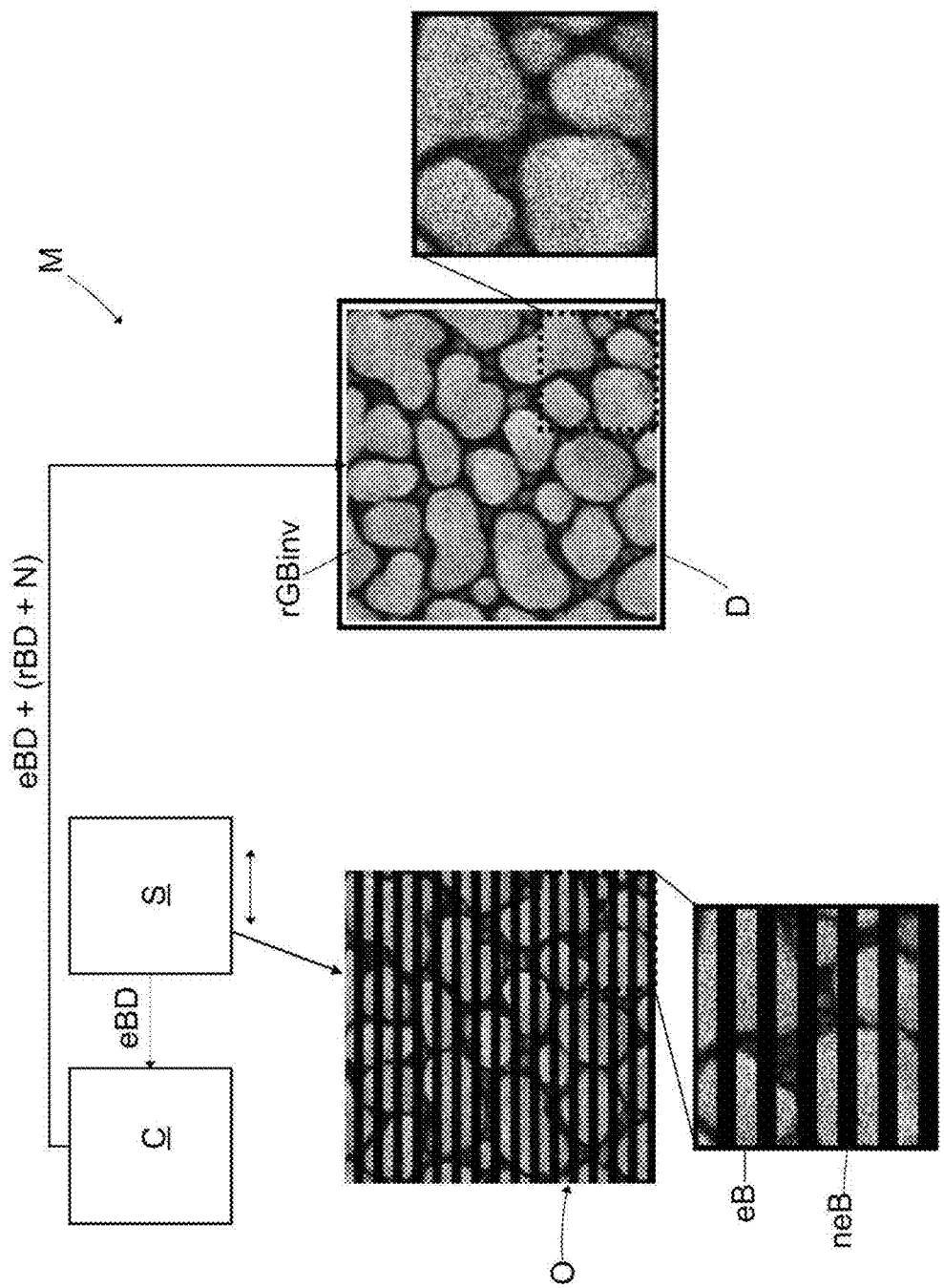
FIG. 3 shows a schematic representation of a configuration of the method according to the invention.
Figure 4:
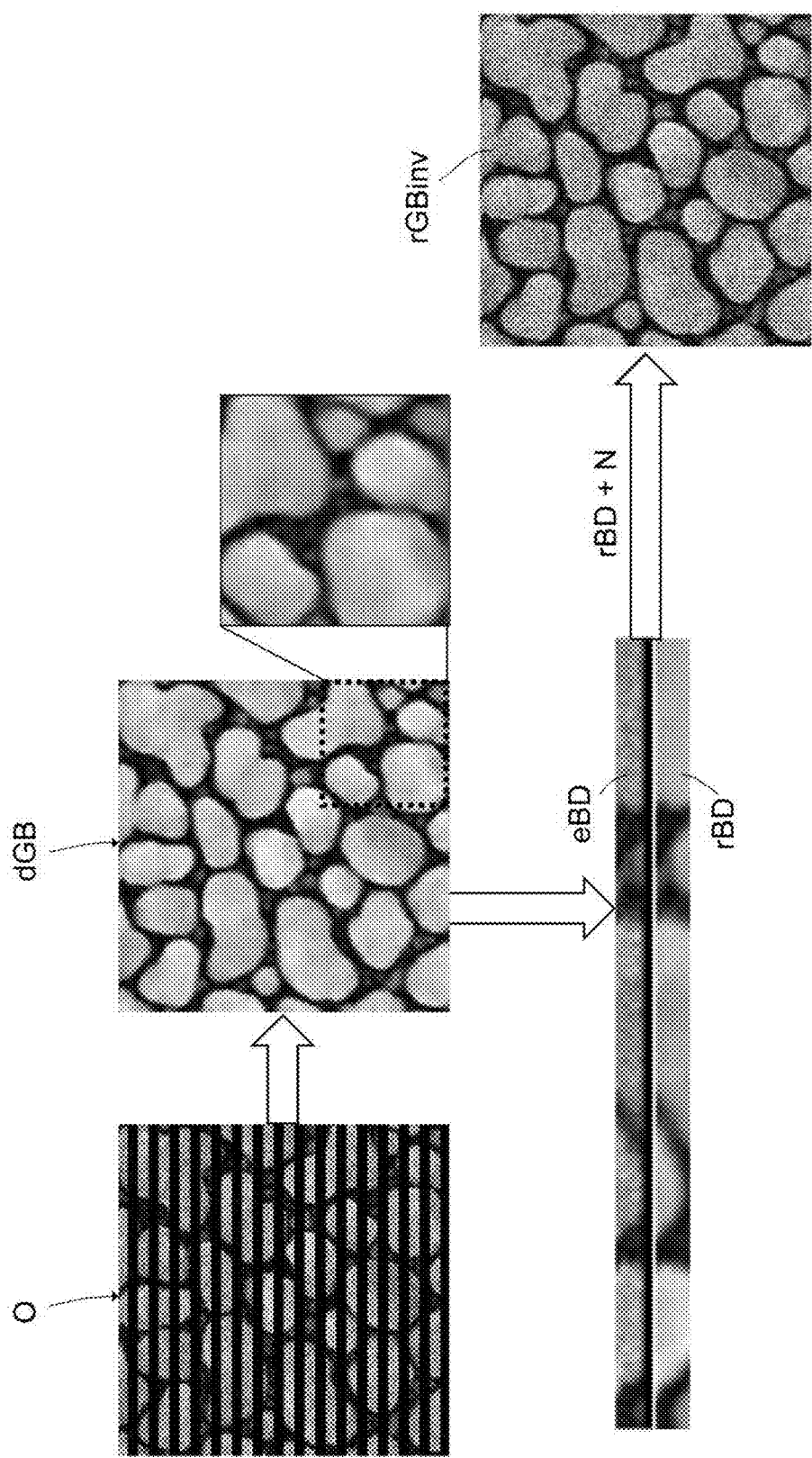
FIG. 4 shows a schematic representation of a possible procedure according to the invention for generating a resultant overall image proceeding from an incompletely scanned object.
Figure 5:
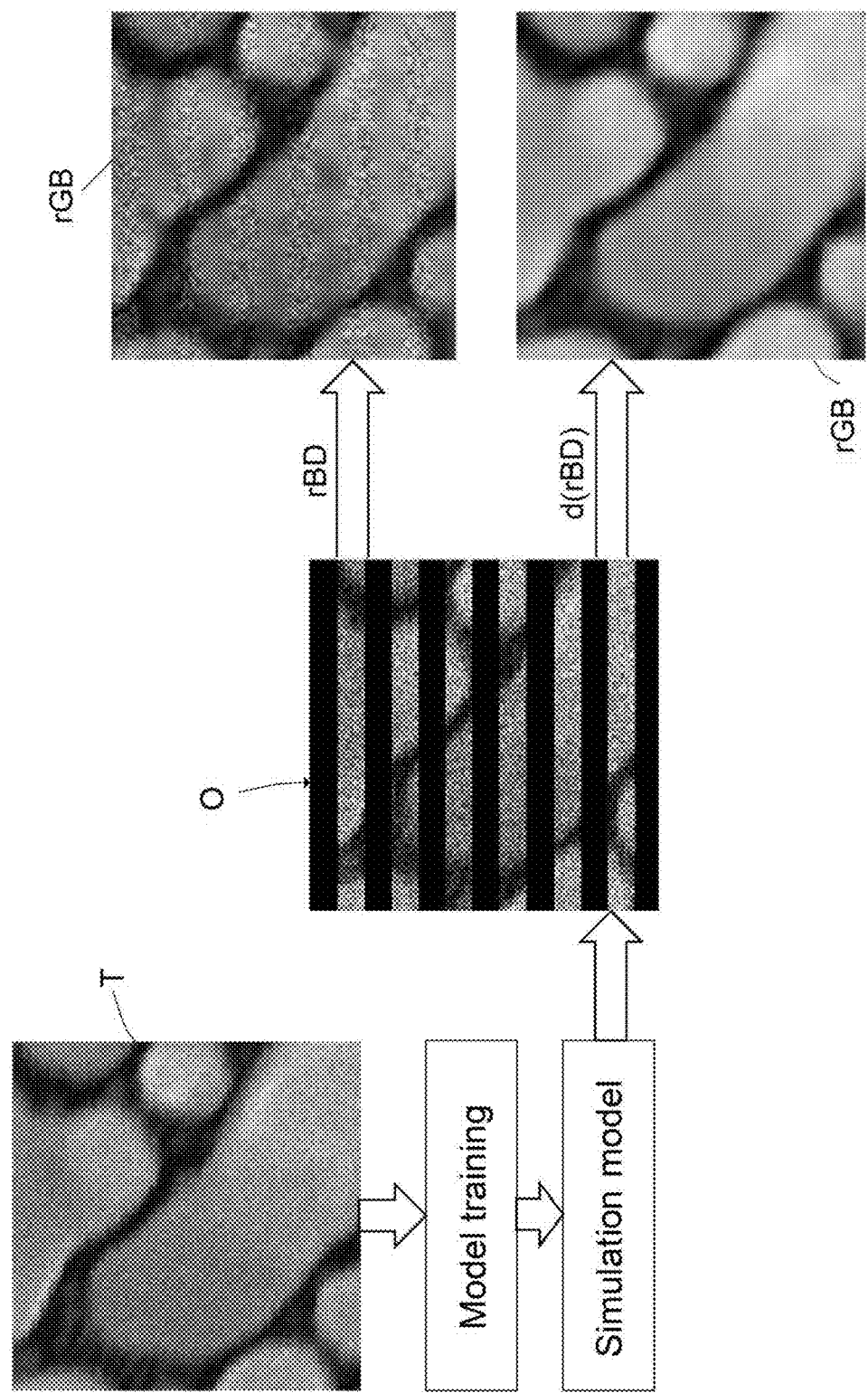
FIG. 5 shows an exemplary representation of training a simulation model and two possible applications.

The invention is explained on the basis of the drawings, in which:

FIG. 1 shows a schematic representation of a first configuration of the method according to the prior art, with an incompletely scanned object;

FIG. 2 shows a schematic representation of a second configuration of the method according to the prior art, with an incompletely scanned object;

FIG. 3 shows a schematic representation of a configuration of the method according to the invention;

FIG. 4 shows a schematic representation of a possible procedure according to the invention for generating a resultant overall image proceeding from an incompletely scanned object; and FIG. 5 shows an exemplary representation of training a simulation model and two possible applications.

Identical technical circumstances and elements will he provided with the same reference signs in the exemplary embodiments that follow.

A first configuration of the method known from the prior art in the technical field of "compressed sensing" is shown schematically in FIG. 1. An object image O of an object to be imaged, which was scanned incompletely, is depicted. The incomplete scanning was implemented by means of a scanning device S, for example in the form of a line-by-line scanning (point) scanner, a line scanner or a controllable point scanner (also referred to in general terms as scanner S below). The further explanations are given using the example of a scanner S that scans line by line.

As a result of incomplete scanning, a data set is obtained, the data set consisting of the sensed image data eBD of lines of sensed image regions eB, with a line of the sensed image regions eB in each case alternating with a non-sensed line (black stripes), which are referred to as non-sensed image regions neB.

The image data eBD sensed by means of the scanner S and a detector not depicted in any more detail are transmitted to a computer C for further processing and/or analysis. Scanner S and computer C are constituent parts of a microscope M not depicted in any more detail, which additionally comprises an objective lens OB used for sensing a detection beam. A reconstruction method of only the non-sensed image regions neB is carried out by means of the computer C or a simulation unit C, which is realized in a computer, a computer network or in a virtual simulation environment. The reconstructed image data rBD of the non-sensed image regions neB obtained thus are put together with the sensed image data eBD of the sensed image regions eB to form a first resultant overall image rGB1, and are optionally displayed on a visual display unit D (only indicated). In this case, the sensed image data eBD include a clear noise signal N (see in particular the enlarged detail) while the reconstructed image data rBD are depicted without a noise signal N. For an observer, the first resultant overall image rGB1 exhibits a clear formation of stripes. Although the sensed image data eBD carry the noise signal N, they are unmodified.

A second configuration of the method (FIG. 2) likewise known from the prior art generates denoised image data d(eBD) by applying a reconstruction method with noise reduction (compressed sensing with denoising) starting from the sensed image data eBD of the sensed image regions eB. These are pieced together with the image data rBD reconstructed without the noise signal N to form a second resultant overall image rGB2, in which neither stripe formation nor noise signal can be identified. This second resultant overall image rGB2 appears very homogeneous to the observer, but suggests an incorrect accuracy and resolution of the obtained overall image rGB2 since the noise signal N has been removed. The actually sensed image data eBD are modified in such a configuration of the method.

In a configuration of the method according to the invention (FIG. 3), the reconstructed image data rBD of the non-sensed image regions neB are predicted or simulated starting from the actually sensed image data eBD. The noise signal N of the sensed image data eBD or a noise signal N equivalent thereto is ascertained or estimated in accordance with one of the procedures described above and applied to the reconstructed image data rBD. The sensed image data eBD and the reconstructed image data rBD provided with the noise signal N are pieced together to form a resultant overall image $rGB_{Inv}$ according to the invention. The latter is provided and optionally displayed on a visual display unit D.

The resultant overall image $rGB_{Inv}$ according to the invention has a noise signal N over its entire extent and therefore gives an observer a uniform visual impression. At the same time, the actually obtained resolution of the resultant overall image $rGB_{Inv}$ according to the invention is highlighted to the observer on account of the noise signal N. The sensed image data eBD remain unchanged in a configuration of the method according to the invention and are available for subsequent analyses when necessary.

In further configurations, the method according to the invention may be implemented according to the basic sequence of FIG. 3, but the sensed image data may be assigned alternatively or additionally to different spectral regions and/or may exist as sensed image data of an undersampling over a specific time period, as described hereinabove.

To ascertain the noise signal N to be applied to the reconstructed image data rBD, a procedure as presented in FIG. 4 can be carried out. An object image O in the form of an incomplete recording of an object is created, as explained in relation to FIGS. 1 to 3. A denoised overall image dGB is generated by means of a simulation model, for example an ML simulation model (machine learning model; deep learning model or deep learning algorithm), using the appropriately set up and configured computer C. Image regions that correspond to one another, lines eB with sensed image data eBD and lines with reconstructed image data rBD corresponding to one another in this exemplary embodiment, are compared and evaluated in a further method step.

The noise signal N is obtained as a result of this comparison; however, it is only applied to the reconstructed image data rBD. Subsequently, the resultant overall image $rGB_{Inv}$ according to the invention is put together from the sensed image data eBD and the reconstructed image data rBD that have been augmented with the noise signal N, and this resultant overall image is made available, in particular stored and/or displayed.

One of the advantages of the invention can be found in the circumstances that no noise-free training data are required for training the simulation models used for the prediction of the resultant overall images $rGB_{Inv}$ according to the invention (FIG. 5). Thus, for example, at least one sensed image of an object can be used as a training image T for training a simulation model of machine learning. The simulation model trained thus can be applied to an incompletely sensed object image O, in particular to the non-sensed regions neB, in order to predict reconstructed image data rBD which are pieced together with the sensed image data eBD to form a resultant overall image rGB. if the noise signal N is impressed on the reconstructed image data rBD, it is possible to generate a resultant overall image $rGB_{Inv}$ according to the invention (see FIGS. 3 and 4).

Alternatively, denoised reconstructed image data d(rBD) on the basis of the incompletely sensed object image O can be generated by means of a trained simulation model. A resultant overall image rGB put together in this way with the sensed image data eBD can be used for example to ascertain the noise signal N, as described in relation to FIG. 4.

REFERENCE SIGNS

C Computer
D Visual display unit
d(eBD) Denoised sensed image data
dGB Denoised overall image
eB Sensed image region
eBD Sensed image data
M Microscope
N Noise signal (noise)
neB Non-sensed image region
O Object image
OB Objective lens
rBD Reconstructed image data
rGB1 First resultant overall image
rGB2 Second resultant overall image
$rGB_{Inv}$ Resultant overall image according to the invention
S scanning apparatus, scanner
T Training image

The invention claimed is:

1. A method for sensing and processing image data, the method comprising:
    incompletely scanning an object to be imaged, wherein incomplete scanning results in sensed image regions (eB) of the object alternating with non-sensed image regions (neB) of the object;
    reconstructing image data of the non-sensed image regions (neB) on the basis of the sensed image data (eBD) of the sensed image regions (eB) to form reconstructed image data (rBD);
    ascertaining a noise signal of the sensed image data (eBD) of the sensed regions (eB); and
    transferring the noise signal of the sensed image data (eBD) to the reconstructed image data (rBD) of the non-sensed regions (neB), to generate a substantially uniform noise distribution across overall image data of the object in a resultant overall image ($rGB_{Inv}$).

2. The method according to claim 1, further comprising:
    applying a selected noise signal to the reconstructed image data (rBD) as a noise signal of the non-sensed regions (neB),
    comparing the effect of the selected noise signal on the reconstructed image data (rBD) of the non-sensed regions (neB) to the sensed image data (eB) of the sensed image regions (eB), and
    verifying an observance of specified similarity criteria, and
    if the specified similarity criteria is not satisfied, making a decision regarding application of a modified noise signal to the reconstructed image data (rBD) of the non-sensed regions (neB), on the basis of a result of the comparison.

3. The method according to claim 1, wherein the reconstructed image data (rBD) of the non-sensed image regions (neB) are generated by a simulation model impressing the noise signal on the reconstructed image data (rBD).

4. The method according to claim 1, wherein the resultant overall image (rGB) is predicted by a simulation model proceeding from the reconstructed image data (rBD) of the non-sensed image regions (neB), with parameters of a microscope (M) used for sensing of the sensed image data (eBD) of the sensed image regions (eB) being taken into account within a scope of the prediction.

5. The method according to claim 1, wherein an expected noise signal of the sensed image data (eBD) of the sensed image regions (eB) is estimated before the object is incompletely scanned, and
    said expected noise signal is impressed following the incomplete scanning, on the reconstructed image data (rBD) of the non-sensed image regions (neB).

6. The method according to claim 1, wherein the incomplete scanning is by an electron microscope.

7. The method according to claim 1, wherein the object is incompletely scanned with at least one first spectral region and one second spectral region, and
    image data of non-sensed image regions (neB) of at least one spectral region are reconstructed in the form of reconstructed image data (rBD).

8. The method according to claim 7, wherein wavelength ranges of the at least one first spectral region and the second spectral region do not overlap one another.

9. The method according to claim 1, wherein the incomplete scanning is implemented only at specific points in time of a time period, and non-sensed image regions (neB) of non-sensed points in time are reconstructed in the form of reconstructed image data (rBD).

10. The method according to claim 1, wherein the incomplete scanning is implemented in a form of a z-stack, along an optical axis of an objective lens (OB) used for sensing of image data.

* * * * *

UNITED STATES PATENT AND TRADEMARK OFFICE
CERTIFICATE OF CORRECTION

PATENT NO. : 12,430,720 B2
APPLICATION NO. : 18/155289
DATED : September 30, 2025
INVENTOR(S) : Amthor et al.

It is certified that error appears in the above-identified patent and that said Letters Patent is hereby corrected as shown below:

On the Title Page

Column 2, Line 4 in OTHER PUBLICATIONS, currently reads:
"Composition"."
And should read:
--Composition",--;

In the Specification

Column 1, Line 9, currently reads:
"reference in its entirety,"
And should read:
--reference in its entirety.--;

Column 1, Lines 24-25, currently reads:
"incomplete scanning),"
And should read:
--incomplete scanning).--;

Column 1, Line 43, currently reads:
"(see DE 10 2018 113 014 A1; for example)."
And should read:
--(see DE 10 2018 113 014 A1, for example).--;

Column 4, Line 47, currently reads:
"he made"
And should read:
--be made--;

Signed and Sealed this
Second Day of December, 2025

John A. Squires
*Director of the United States Patent and Trademark Office*

CERTIFICATE OF CORRECTION (continued)
U.S. Pat. No. 12,430,720 B2

Column 5, Line 55, currently reads:
"he made"
And should read:
--be made--;

Column 6, Line 41, currently reads:
"may he"
And should read:
--may be--;

Column 6, Line 49, currently reads:
"it is possible"
And should read:
--It is possible--;

Column 6, Line 58, currently reads:
"to he kept"
And should read:
--to be kept--;

Column 7, Line 52, currently reads:
"elements will he"
And should read:
--elements will be--; and Column 9, Line 38, currently reads:
"if the noise"
And should read:
--If the noise--.